(12) United States Patent
Castelli et al.

(10) Patent No.: US 11,342,938 B1
(45) Date of Patent: May 24, 2022

(54) METHOD AND APPARATUS FOR CODEWORD ALIGNMENT

(71) Applicant: Xilinx, Inc., San Jose, CA (US)

(72) Inventors: Jonathan Castelli, Edinburgh (GB); Ben Jones, Edinburgh (GB); Gordon Old, Balerno (GB)

(73) Assignee: Xilinx, Inc., San Jose, CA (US)

( * ) Notice: Subject to any disclaimer, the term of this patent is extended or adjusted under 35 U.S.C. 154(b) by 78 days.

(21) Appl. No.: 16/856,191

(22) Filed: Apr. 23, 2020

(51) Int. Cl.
  *H03M 13/00* (2006.01)
  *H03M 13/15* (2006.01)

(52) U.S. Cl.
  CPC ................................ *H03M 13/1575* (2013.01)

(58) Field of Classification Search
  CPC .................................................. H03M 13/1575
  See application file for complete search history.

(56) References Cited

U.S. PATENT DOCUMENTS

| | | | | |
|---|---|---|---|---|
| 7,042,969 B2* | 5/2006 | Lai | ...................... | H04L 27/2656 327/310 |
| 7,978,972 B2* | 7/2011 | Ohira | .................. | H03M 13/152 398/25 |
| 8,458,560 B2* | 6/2013 | Nichols | ............. | H03M 13/6561 714/762 |
| 8,924,826 B2* | 12/2014 | Kim | ...................... | H03M 13/31 714/785 |
| 9,166,739 B2* | 10/2015 | Sakai | ..................... | H04L 1/0052 |
| 9,778,389 B2* | 10/2017 | Stolpman | ............... | H04B 13/02 |
| 9,819,892 B2* | 11/2017 | Latremouille | ........... | H04N 5/38 |
| 10,673,561 B1* | 6/2020 | Farjad | ..................... | H04L 27/04 |

OTHER PUBLICATIONS

INCITS, American National Standard of Accredited Standards Committee, "Fibre Channel—Fibre Channel Framing and Signaling—4 (FC-FS-4)," American National Standard for Information Technology, American National Standards Institute, Inc., Project T11/2238-D, Rev 1.40, pp. 1-463, Oct. 7, 2015.

* cited by examiner

*Primary Examiner* — Esaw T Abraham
(74) *Attorney, Agent, or Firm* — Paradice and Li LLP

(57) ABSTRACT

An apparatus and method for determining an alignment of a codeword is disclosed. A data stream may be received, and a cumulative syndrome value determined. The cumulative syndrome value may be based on error correction and data scrambling operations performed on the data stream. If the cumulative syndrome value matches a predetermined cumulative syndrome value, then alignment of the codeword with respect to the data stream is determined.

18 Claims, 3 Drawing Sheets

US 11,342,938 B1

METHOD AND APPARATUS FOR CODEWORD ALIGNMENT

TECHNICAL FIELD

Aspects of the present disclosure generally relate to data processing and specifically to determining codeword alignment within a data stream.

BACKGROUND

Data may be transmitted between two or more electrical devices such as a transmitting device and a receiving device. The data may be divided into codewords of fixed length and processed with forward error correction and data scrambling prior to transmission through a channel to enable detection and correction of a number of errors without the need for retransmission. Forward error correction adds parity information that is transmitted along with the original data. Data scrambling may help ensure a relatively even distribution of ones (1s) and zeros (0s) in the data stream to ease clock recovery during reception. Together, the forward error correction and the data scrambling help ensure robust reception of data by the receiving device.

After a receiving device receives the data stream, the receiving device may process the data stream by descrambling the data and correcting errors using the forward error correction parity information. However, before the data stream can be processed, the receiving device needs to determine the alignment of the codewords within the data stream. The forward error correction processing and the data scrambling performed by the transmitting device may complicate the determination of the codeword alignment.

Therefore, there is a need for efficient detection of codeword alignment within a data stream.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter described in this disclosure can be implemented as a method of determining an alignment of a codeword within a data stream. The method of determining may include determining a cumulative syndrome value of the data stream, where the cumulative syndrome value is based at least in part on error correction operations and data scrambling operations performed on the data stream; comparing the cumulative syndrome value to a plurality of predetermined syndrome values; and determining the alignment of the codeword relative to the data stream based on the comparison. In some implementations, the alignment of the codeword is determined when the cumulative syndrome value matches at least one of the predetermined cumulative syndrome values.

Another innovative aspect of the subject matter described in this disclosure can be implemented as a device. The device may include a receiver configured to receive a data stream. The device may also include an alignment detector configured to: determine a cumulative syndrome value of the data stream, where the cumulative syndrome value is based at least in part on error correction operations and data scrambling operations performed on the data stream; compare the cumulative syndrome value to a plurality of predetermined syndrome values; and determine an alignment of a codeword relative to the data stream based on the comparison.

Another innovative aspect of the subject matter described in this disclosure can be implemented as a device. The device may include a means for determining a cumulative syndrome value of a data stream, where the cumulative syndrome value is based at least in part on error correction operations and data scrambling operations performed on the data stream. The device may also include a means for comparing the cumulative syndrome value to a plurality of predetermined cumulative syndrome values. The device may also include a means for determining an alignment of a codeword relative to the data stream based on the comparison.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

Figure 1:
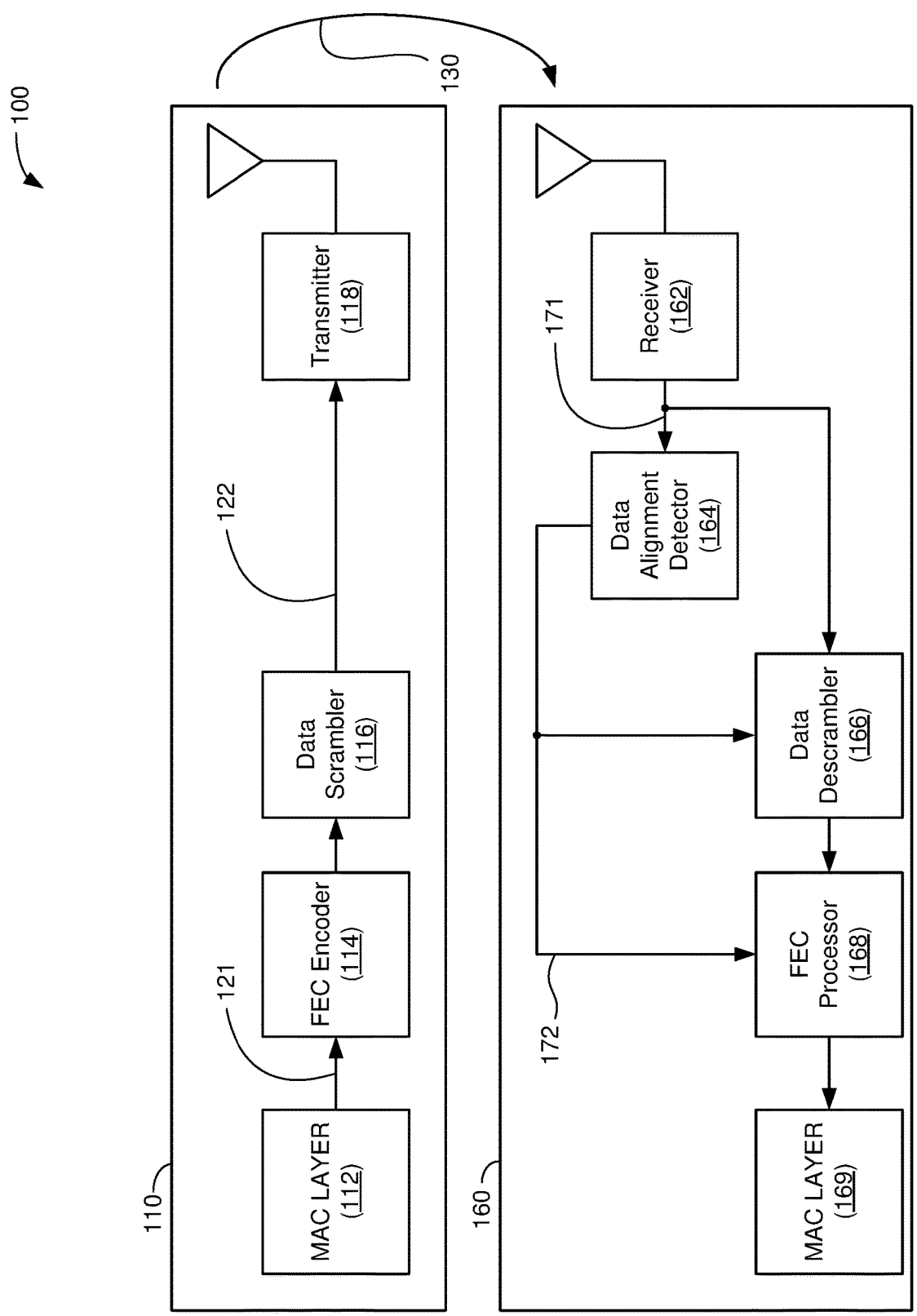
FIG. 1 shows a block diagram of an example communication system.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

A codeword may include a predetermined number of data bits that are grouped together within a data stream. Each codeword may have been subject to forward error correction coding and data scrambling. The beginning and the end of the codeword in the data stream may be referred to as codeword alignment. Implementations of the subject matter described in this disclosure may be used for determining the codeword alignment within a data stream. A cumulative syndrome value may be determined based the data stream.

If the cumulative syndrome value matches one of a number of predetermined cumulative syndrome values, then the alignment of the codeword with respect to the data stream is known. If the cumulative syndrome value does not match one of the number of predetermined, then alignment of the codeword is undetermined.

Particular implementations of the subject matter described in this disclosure can be implemented to realize one or more of the following potential advantages. Conventionally, codeword alignment may be determined by exhaustively examining all possible alignments until error-corrected and data descrambled data is correctly recovered from the data stream. For example, if a codeword includes 4000 data bits, then, in a worse case, 4000 possible codeword-to-data stream alignments may be checked to determine codeword alignment. Compared to conventional methods, using cumulative syndrome values can determine codeword alignment more quickly. In some implementations, multiple cumulative syndrome values may be determined during a period of time associated with one codeword. In other words, codeword alignment may be tested for multiple times during the time that one codeword may be transmitted through the data stream, instead of only once during the same period of time.

FIG. 1 shows a block diagram of an example communication system 100. The communication system 100 includes a transmitting device 110 and a receiving device 160. The transmitting device 110 may transmit a data stream through a wireless channel 130 to the receiving device 160. In some other implementations, the transmitting device 110 may be a physically coupled to the receiving device 160 by transmitting a data stream through an electrical conductor such as copper, doped silicon, or the like, or through an optical conductor such as glass, air, or any other feasible transmissive medium.

The transmitting device 110 may include a media access control (MAC) layer 112, a forward error correction (FEC) encoder 114, a data scrambler 116, and a transmitter 118. The MAC layer 112 may provide data 121 for transmission to the FEC encoder 114. The FEC encoder 114 may add parity information to the data 121 and provide the FEC encoded data to the data scrambler 116. The data scrambler 116 may scramble the FEC encoded data by performing any feasible data scrambling operation such as 8b/10b scrambling (eight bit to ten bit scrambling) or 64b/66b scrambling (64 bit to 66 bit scrambling). The data scrambler 116 may provide a FEC encoded and scrambled data stream 122 to the transmitter 118. The transmitter 118 may be a gigabit transmitter, a 10G transmitter, or any other feasible data transmitter.

In some implementations, the data stream 122 may be divided into codewords of a fixed length Lcw. Each codeword may be further divided into a fixed number of words (m words), each word having a fixed number of bits (n bits). The codewords may be based on the FEC and data scrambling operations provided by the FEC encoder 114 and the data scrambler 116, respectively. As a non-limiting example, the communication system 100 may transmit and receive a data stream in accordance with a Common Public Radio Interface (CPRI) protocol. The CPRI protocol divides the data stream into a codeword having an Lcw of 5280 bits. The codeword is further divided into eighty (80) words (e.g., m=80), each word having 66 bits (e.g., n=66).

The transmitter 118 may transmit the data stream 122 through the wireless channel 130 to the receiving device 160. The receiving device 160 may include a receiver 162, a data alignment detector 164, a data descrambler 166, a FEC processor 168, and a MAC layer 169. In some implementations, the receiver 162 may be a gigabit receiver, a 10G receiver, or any other feasible data receiver.

The receiver 162 may provide a data stream 171 to the data alignment detector 164. The data stream 171 may be similar to the data stream 121. In some instances, the data stream 171 may include one or more errors. Because the transmitting device 110 and the receiving device 160 may have no common timing reference, and furthermore, since no codeword alignment information may be transmitted with the data stream 122, the receiving device 160 may not recognize any codeword alignment in the data stream 171. Without codeword alignment information, descrambling and error correcting operations may not be possible. The data alignment detector 164 may analyze the data stream 171 and determine codeword alignment with respect to the data stream 171. The data alignment detector 164 may provide codeword alignment information 172 to the data descrambler 166 and the FEC processor 168 to enable data descrambling and error correction operations, respectively.

The data descrambler 166 may descramble the data stream 171 based on the codeword alignment information 172. In some implementations, the data descrambler 166 may reverse the scrambling operation performed by the data scrambler 116. The data descrambler 166 may provide descrambled data to the FEC processor 168. The FEC processor 168 may detect and correct errors and provide error-corrected data to the MAC layer 169.

In some implementations, the transmitting device 110 and the receiving device 160 may each be transceiving devices that perform both transmitting and receiving operations. In such implementations, the associated blocks of the transceiving devices may be configured to perform either receiving or transmitting operations based on whether the associated device is transmitting or receiving a data stream. For example, the FEC encoder 114 and the FEC processor 168 may be replaced with a universal FEC processor that can add parity information or detect and correct errors based on the parity information. In a similar manner, data scrambler 116 and the data descrambler 166 may be replaced with a universal scrambling/descrambling block. Finally, the transmitter 118 and the receiver 162 may be replaced with universal transceivers that may transmit data or receive data through the communication channel.

Figure 2:
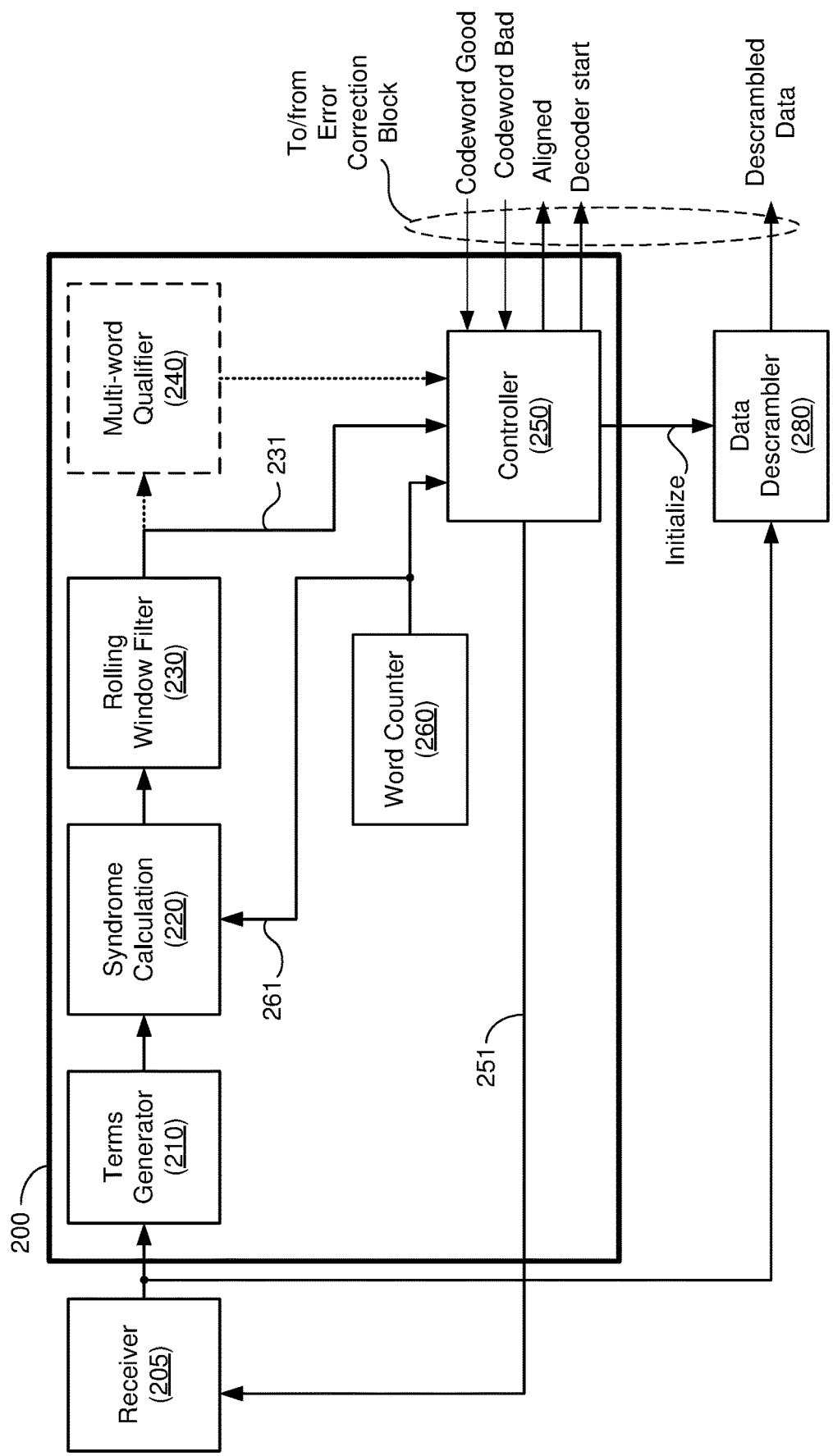
FIG. 2 shows a block diagram of an example data alignment detector.

FIG. 2 shows a block diagram of an example data alignment detector 200. The data alignment detector 200 may be one implementation of the data alignment detector 164 of FIG. 1. The data alignment detector 200 may include a terms generator 210, a syndrome calculation block 220, a rolling window filter 230, a controller 250, and a word counter 260. As shown, the data alignment detector 200 may be coupled to a receiver 205 and a data descrambler 280. The receiver 205 may be one implementation of the receiver 162 and the data descrambler 280 may be one implementation of the data descrambler 166. Further, the data alignment detector 200 also may be coupled to an error correction block such as the FEC processor 168 (not shown for simplicity).

The data alignment detector 200 may determine codeword alignment with respect to a data stream based on a cumulative syndrome value. When the cumulative syndrome value matches at least one predetermined value, then the alignment of the codeword is known. In some implementations, the cumulative syndrome value may be based on error correction operations and data scrambling operations performed by a transmitting device, such as the transmitting device 110. Persons having ordinary skill in the art will recognize that error correction operations, such as FEC operations, may use a number of different syndromes to detect and correct errors within a codeword. For example, a syndrome may include a number of bits that can indicate one or more errors within the codeword and, in some cases, may be used to correct the errors. By way of a non-limiting example, Hamming Codes may add additional parity bits a data word to generate a codeword. To decode and error correct the codeword, a syndrome may be generated based on the parity bits to locate and correct bit errors. In some implementations, a syndrome value (in some cases related to the syndrome used to detect and correct errors) may be used to determine codeword alignment.

The terms generator 210 may receive a data stream from the receiver 205. As described with respect to FIG. 1, the data stream may include a codeword having Lcw bits that are divided into m words, each word including n bits. Thus, in some implementations, the data stream may be n bits wide (e.g., the associated word width and/or bus width of the data stream is n bits). The codeword may be included in m clock cycles of the data stream. The terms generator 210 may generate "terms" (e.g., values based on a logical expression or equation) based on a data bus of n bits that may be used to calculate a partial syndrome value provided to the syndrome calculation block 220. In some implementations, for each clock cycle, the terms generator 210 may generate a 10-bit "term" based on an exclusive or (XOR) operation of the n bits the data bus. In the example of a CPRI compliant data stream, the terms generator 210 may generate the 10-bit term for 66 data bits (n=66) as shown below in table 1.

TABLE 1

| term_0 = | data_in[0]^data_in[10]^data_in[20]^data_in[30]^data_in[40]^data_in[50]^data_in[60] |
|---|---|
| term_1 = | data_in[1]^data_in[11]^data_in[21]^data_in[31]^data_in[41]^data_in[51]^data_in[61] |
| term_2 = | data_in[2]^data_in[12]^data_in[22]^data_in[32]^data_in[42]^data_in[52]^data_in[62] |
| term_3 = | data_in[3]^data_in[13]^data_in[23]^data_in[33]^data_in[43]^data_in[53]^data_in[63] |
| term_4 = | data_in[4]^data_in[14]^data_in[24]^data_in[34]^data_in[44]^data_in[54]^data_in[64] |
| term_5 = | data_in[5]^data_in[15]^data_in[25]^data_in[35]^data_in[45]^data_in[55]^data_in[65] |
| term_6 = | data_in[6]^data_in[16]^data_in[26]^data_in[36]^data_in[46]^data_in[56] |
| term_7 = | data_in[7]^data_in[17]^data_in[27]^data_in[37]^data_in[47]^data_in[57] |
| term_8 = | data_in[8]^data_in[18]^data_in[28]^data_in[38]^data_in[48]^data_in[58] |
| term_9 = | data_in[9]^data_in[19]^data_in[29]^data_in[39]^data_in[49]^data_in[59] |

Although Table 1 shows terms for one possible partial syndrome value, any other expressions or equations are possible to determine other terms for other partial syndrome values.

The terms generator 210 may provide a partial syndrome value to the syndrome calculation block 220. The syndrome calculation block 220 may compute a current cumulative syndrome value by XORing together multiple partial syndrome values.

Returning to the CPRI compliant data stream example, each word of the data stream may include 66 bits and be denoted data_in[65]–data_in[0]. Persons having ordinary skill in the art will recognize that the 10-bit partial syndrome value of Table 1 may not readily align with a 66-bit word. That is, successive data stream words may not have similar data bits in the same logical position, causing errors in calculating the partial syndrome value. To accommodate the moving alignment of data bits within successive data stream words, the syndrome calculation block 220 may re-order the terms from the terms generator 210 to determine the partial cumulative syndrome value on each clock cycle. Depending on successive data bit alignments (e.g., the alignment of data bits within successive codewords), the terms may "rotate" through a number of different arrangements. The different arrangements may enable successive data bits to align in successive data stream words. For example, if during a first clock cycle, data_in[0] was the first bit (that is, data_in[0] is located in a first logical position) in the received 66-bit word, then in the following clock cycle, data_in[6] would be located in the first logical position and data_in[0] would be in a fifth logical position. Thus, the terms from the terms generator 210 for the second clock cycle may be re-ordered by the syndrome calculation block 220 to accommodate this change. By way of non-limiting example, for one particular repeating cycle of data bit alignments, the terms from the terms generator 210 may be re-ordered by the syndrome calculation block 220 according to Table 2 below:

TABLE 2

|  | Clock 0 | Clock 1 | Clock 2 | Clock 3 | Clock 4 |
|---|---|---|---|---|---|
| bit[0] | term_0 | term_6 | term_2 | term_8 | term_4 |
| bit[1] | term_1 | term_7 | term_3 | term_9 | term_5 |
| bit[2] | term_2 | term_8 | term_4 | term_0 | term_6 |
| bit[3] | term_3 | term_9 | term_5 | term_1 | term_7 |
| bit[4] | term_4 | term_0 | term_6 | term_2 | term_8 |
| bit[5] | term_5 | term_1 | term_7 | term_3 | term_9 |
| bit[6] | term_6 | term_2 | term_8 | term_4 | term_0 |
| bit[7] | term_7 | term_3 | term_9 | term_5 | term_1 |

TABLE 2-continued

|  | Clock 0 | Clock 1 | Clock 2 | Clock 3 | Clock 4 |
|---|---|---|---|---|---|
| bit[8] | term_8 | term_4 | term_0 | term_6 | term_2 |
| bit[9] | term_9 | term_5 | term_1 | term_7 | term_3 |

As shown, the terms re-ordering operation performed by the syndrome calculation block 220 may repeat periodically every 5 clock cycles (e.g., the terms re-ordering operation may have a repeat period of 5 clock cycles). Thus, clock cycle 5 will use the column for clock 0, clock 6 will use the column for clock 1, and so on. Further, Table 2 illustrates one possible terms re-ordering operation. Other terms and/or re-orderings are possible and are not shown here for simplicity. In some implementations, a different re-ordering of terms may be associated with different codeword alignments with respect to the data stream. For example, if data_in[1] was the first bit (e.g., data_in[1] is located in a first logical position) in a first received 66-bit word, then in the next 66-bit word, data_in[1] may be located in fifth logical position. Therefore, different terms may be defined for each row in Table 2 resulting in Table 3 below:

TABLE 3

|        | Clock 0 | Clock 1 | Clock 2 | Clock 3 | Clock 4 |
|--------|---------|---------|---------|---------|---------|
| bit[0] | term_1  | term_7  | term_3  | term_9  | term_5  |
| bit[1] | term_2  | term_8  | term_4  | term_0  | term_6  |
| bit[2] | term_3  | term_9  | term_5  | term_1  | term_7  |
| bit[3] | term_4  | term_0  | term_6  | term_2  | term_8  |
| bit[4] | term_5  | term_1  | term_7  | term_3  | term_9  |
| bit[5] | term_6  | term_2  | term_8  | term_4  | term_0  |
| bit[6] | term_7  | term_3  | term_9  | term_5  | term_1  |
| bit[7] | term_8  | term_4  | term_0  | term_6  | term_2  |
| bit[8] | term_9  | term_5  | term_1  | term_7  | term_3  |
| bit[9] | term_0  | term_6  | term_2  | term_8  | term_4  |

In some implementations, the terms re-ordering operation may have a different repeat period than what is depicted in Table 2 or Table 3 (e.g., a repeat period other than five clock cycles). The repeat period may be based on a least common multiple between the partial syndrome value bit width (in this example, ten bits) and word width (in this example, 66 bits). Since the least common multiple is 330, a 66-bit word alignment repeats every 5 clock cycles (e.g., 5*66 is 330). In other implementations, different partial syndrome value bit widths and different word widths may have different least common multiples and, therefore, different repeat periods.

A current cumulative syndrome value is generated by XORing together m partial cumulative syndrome values, each partial cumulative syndrome value made available by the terms generator 210 for each clock cycle. To complete the cumulative syndrome value calculation, a cumulative syndrome value of a previous codeword may be subtracted from the current cumulative syndrome value by the rolling window filter 230. In some implementations, subtraction of the cumulative syndrome values may be performed by XORing the current cumulative syndrome value with the previous cumulative syndrome value. In some implementations, the rolling window filter 230 may include a delay block (not shown for simplicity) that is as deep and/or long as the number of words (m words) in a codeword. Returning to the CPRI compliant data example, the rolling window filter 230 may use a delay block to provide 80 clocks of delay (m=80). The resulting output of the delay block may provide the cumulative syndrome value of the previous codeword. Therefore, each clock cycle, the rolling window filter 230 outputs a cumulative syndrome value 231 that may be associated with a codeword aligned to the present word.

If the cumulative syndrome value from the rolling window 230 has a predetermined value, then the data alignment detector 200 knows how the codewords are aligned in the data stream. Returning to the CPRI compliant data example, if the cumulative syndrome value has one of five predetermined values: 0x0F9, 0x393, 0x24F, 0x3E4, and 0x13E then the codeword alignment is known. The predetermined cumulative syndrome values may correspond to a syndrome value of zero for an error-free data stream was first descrambled prior to syndrome computation. Other predetermined syndrome values are possible for other FEC schemes, other error correction schemes, and other data scrambling schemes.

Thus, if the rolling window filter 230 provides one of the five predetermined cumulative syndrome values, then the data alignment detector 200 knows how the codewords are aligned in the data stream. In this manner, the data alignment detector 200 may assess codeword alignment each clock cycle of the data stream. Thus, codeword alignment may be determined multiple times per codeword. Determining codeword alignment multiple times per codeword may enable a receiving device (such as the receiving device 160 of FIG. 1) to decode and error correct a data stream faster than conventional methods. For example, when the data stream has been interrupted or the receiver 205 has transitioned to receiving a different data stream, the data alignment detector 200 may more quickly locate the beginning of the codeword to begin decoding and descrambling operations, compared to a conventional approach.

In some implementations, the cumulative syndrome values from the rolling window filter 230 may be provided to the controller 250. The controller 250 may determine if the cumulative syndrome value 231 matches a predetermined value and may generate an "aligned" signal for the error correction block. The error correction block may use the aligned signal to control, at least in part, error detection and correction of the data stream.

If the cumulative syndrome value 231 from the rolling window filter 230 does not match a predetermined value, then the data alignment detector does not know how the codewords are aligned in the data stream. In some implementations, the codeword may be mis-aligned by one or more bits. Thus, the controller 250 may assert a bitslip signal 251 for the receiver 205. The bitslip signal 251 may cause the receiver 205 to shift the data stream by at least one bit. New cumulative syndrome values may be determined with respect to the shifted data stream to determine codeword alignment. Thus, the bitslip signal 251 may be asserted if the cumulative syndrome value 231 does not match a predetermined value and may be de-asserted otherwise. In some implementations, the controller 250 may receive codeword good and codeword bad signals from the error correction block. The controller 250 may assert the bitslip signal 251 if the codeword bad signal indicates a poor or misalignment of a codeword in the data stream. In some implementations, the aligned signal may be further qualified by the codeword good signal. For example, if the controller 250 receives the codeword good signal a predetermined number of times in a row, then the controller 250 may assert the aligned signal.

In some implementations, the controller 250 may receive a word count 261 from the word counter 260. The word counter 260 may count the words received in the data stream. In some implementations, the word count may begin at zero and have a terminal count (end count) related to the number of words in a complete codeword. Returning to the CPRI compliant data stream example, since a codeword includes 80 words, the word counter 260 may count from zero to 79 and then reset to zero.

The controller 250 may use the word count 261 and the cumulative syndrome value 231 to generate a decoder start signal for the error correction block. The decoder start signal may indicate the error correction block to begin error detection and correction of the data stream. The syndrome calculation block 220 may use the word count 261 to re-order terms from the terms generator 210.

The controller 250 may also generate an initialize signal for the data descrambler 280. In some implementations, the initialize signal may indicate a first bit with respect to the codeword, thereby enabling the data descrambler 280 to descramble the data stream and provide descrambled data to the error correction block.

In some implementations, the data alignment detector 200 may include an optional multi-word qualifier 240 (shown in dashed lines). The multi-word qualifier 240 may store previous cumulative syndrome values from the rolling window filter 230 for a number of previous codewords. If all the stored previous cumulative syndrome values match the predetermined value, then the codeword alignment is known and can be indicated to the controller 250. The multi-word qualifier 240 may compare any feasible number of previous cumulative syndrome values. In some implementations, the multi-word qualifier 240 may compare two previous cumulative syndrome values and the current cumulative syndrome value (e.g., three cumulative syndrome values). In some other implementations, more or fewer cumulative syndrome values may be compared. The multi-word qualifier 240 may reduce the frequency of "false positive" detections of codeword alignment by detecting multiple (across two or more codewords) cumulative syndrome values that match a predetermined value. The operation of the data alignment detector 200 is described in more detail below with respect to FIG. 3.

Figure 3:
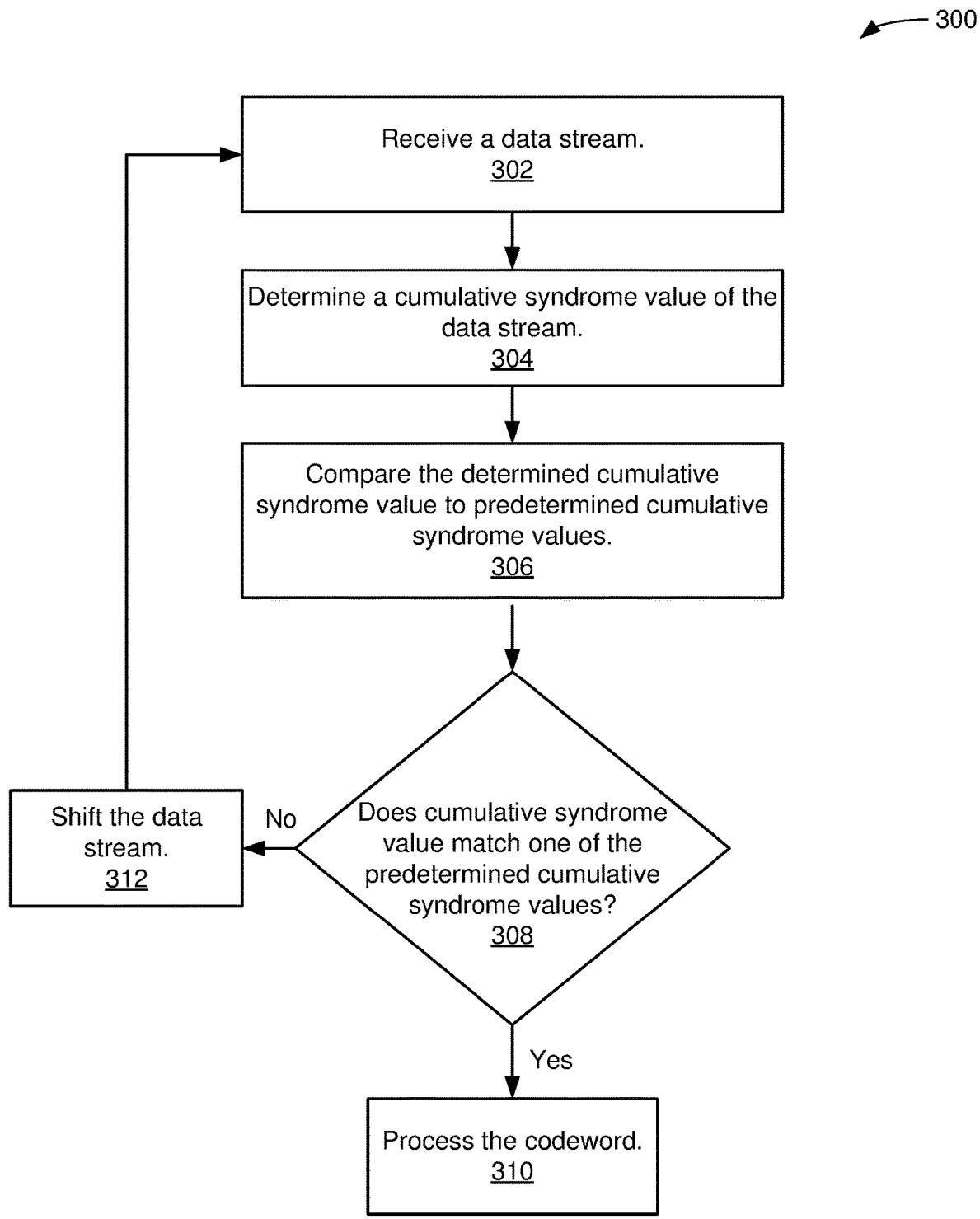
FIG. 3 shows an illustrative flow chart depicting an example operation for determining the alignment of a codeword with respect to a data stream.

FIG. 3 shows an illustrative flow chart depicting an example operation 300 for determining the alignment of a codeword with respect to a data stream. Although described herein as being performed by the data alignment detector 200 of FIG. 2, the operation 300 may be performed by any technically feasible processor, device, hardware platform, or the like. Some implementations may perform the operations described herein with additional operations, fewer operations, operations in a different order, operations in parallel, and/or some operations differently.

The data alignment detector 200 receives a data stream (302). In some implementations, the data stream may be received from a receiver such as a gigabit receiver, a gigabit transceiver, or any other feasible data receiver. The data alignment detector 200 determines a cumulative syndrome value of the data stream (304). In some implementations, the cumulative syndrome value may be a combination of two or more partial syndrome values. As described with respect to FIG. 2, the partial and cumulative syndrome values may be based on error detection/correction and data scrambling operations performed on the data stream. In some other implementations, the cumulative syndrome value may be based on a combination of a current cumulative syndrome value and a cumulative syndrome value of a previous codeword.

The data alignment detector 200 compares the cumulative syndrome value to a number of predetermined cumulative syndrome values (306). The predetermined cumulative syndrome values may be associated with a codeword aligned with respect to the data stream. In other words, if the cumulative syndrome value matches one of the predetermined cumulative syndrome values, then the data alignment detector 200 knows the alignment of the codeword.

If the cumulative syndrome value matches one of the predetermined cumulative syndrome values (tested at 308), then the alignment of the codeword with respect to the data stream is determined and the codeword is processed (310). In some implementations, codeword processing may include error detection and correction operations and data descrambling operations. On the other hand, if the cumulative syndrome value does not match one of the predetermined cumulative syndrome values, then the data alignment detector may shift the data stream (312). In some implementations, the data alignment detector 200 may assert a bitslip signal to shift the data stream one or more bits. The operation returns to 302.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method of determining an alignment of a codeword within a data stream, comprising:
   performing error correction operations and data scrambling operations that add parity information to the data stream;
   determining a cumulative syndrome value of the data stream, wherein the cumulative syndrome value is based on the parity information added to the data stream;
   determining whether the cumulative syndrome value matches a predetermined syndrome value of a plurality of predetermined syndrome values; and
   determining that a codeword is aligned relative to the data stream in response to the cumulative syndrome value matching the predetermined syndrome value.

2. The method of claim 1, wherein determining the cumulative syndrome value comprises:
   subtracting a current cumulative syndrome value from a cumulative syndrome value associated with a previous codeword.

3. The method of claim 1, wherein determining the cumulative syndrome value comprises:
   determining a partial syndrome value for each word in a codeword; and
   exclusive or-ing (XOR) together the partial syndrome values.

4. The method of claim 3, wherein each bit of the partial syndrome value is based on a unique logical expression.

5. The method of claim 4, wherein ordering of the unique logical expression is based at least in part on a least common multiple of a number of bits in the codeword and a number of bits in the partial syndrome value.

6. The method of claim 1, wherein the plurality of predetermined syndrome values are based on a forward error correction operation (FEC).

7. The method of claim 6, wherein the FEC is associated with the Common Public Radio Interface (CPRI).

8. The method of claim 7, wherein the plurality of predetermined syndrome values are selected from the group consisting of 0x0F9, 0x393, 0x24F, 0x3E4, and 0x13E.

9. The method of claim 1, wherein the data scrambling operations are associated with the CPRI.

10. A device comprising:
a receiver configured to receive a data stream; and
an alignment detector configured to:
determine a cumulative syndrome value of the data stream, wherein the cumulative syndrome value is based at least in part on parity information added to the data stream by error correction operations and data scrambling operations performed on the data stream;
determine whether the cumulative syndrome value matches a predetermined syndrome value of a plurality of predetermined syndrome values; and
determine that a codeword is aligned relative to the data stream in response to the cumulative syndrome value matching the predetermined syndrome value.

11. The device of claim 10, wherein the alignment detector is configured to subtract a current cumulative syndrome value from a cumulative syndrome value associated with a previous codeword to determine the cumulative syndrome value.

12. The device of claim 10, wherein the alignment detector is configured to:
determine a partial syndrome value for each word in a codeword; and
exclusive or (XOR) together the partial syndrome values.

13. The device of claim 12, wherein each bit of the partial syndrome value is based on a unique logical expression.

14. The device of claim 13, wherein ordering of the unique logical expression is based at least in part on a least common multiple of a number of bits in the codeword and a number of bits in the partial syndrome value.

15. The device of claim 10, wherein the plurality of predetermined syndrome values are based on a forward error correction operation (FEC) associated with the Common Public Radio Interface (CPRI).

16. A device comprising:
means for performing error correction operations and data scrambling operations that add parity information to a data stream;
means for determining a cumulative syndrome value of the data stream, wherein the cumulative syndrome value is based on the parity information added to the data stream;
means for determining whether the cumulative syndrome value matches a predetermined syndrome value of a plurality of predetermined syndrome values; and
means for determining that a codeword is aligned relative to the data stream in response to the cumulative syndrome value matching the predetermined syndrome value.

17. The device of claim 16, wherein the means for determining the cumulative syndrome value comprises:
determining a partial syndrome value for each word in a codeword; and
exclusive or-ing (XOR) together the partial syndrome values.

18. The device of claim 17, wherein each bit of the partial syndrome value is based on a unique logical expression.

* * * * *